(12) United States Patent
Kim

(10) Patent No.: US 7,888,802 B2
(45) Date of Patent: Feb. 15, 2011

(54) BONDING PAD STRUCTURE AND MANUFACTURING METHOD THEREOF

(75) Inventor: Kyoung-Hwan Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/608,018

(22) Filed: Oct. 29, 2009

(65) Prior Publication Data

US 2010/0155958 A1 Jun. 24, 2010

(30) Foreign Application Priority Data

Dec. 18, 2008 (KR) .................. 10-2008-0129274

(51) Int. Cl.
*H01L 23/488* (2006.01)

(52) U.S. Cl. .............. 257/758; 257/E23.023; 257/773; 438/612

(58) Field of Classification Search .......... 257/773, 257/E23.023, 758, 786, 775, E21.59; 438/612, 438/622, 118, 666, 638, 629
See application file for complete search history.

(56) References Cited

U.S. PATENT DOCUMENTS 5,149,674 A * 9/1992 Freeman et al. ............ 438/612
5,739,587 A * 4/1998 Sato ........................... 257/758
6,207,547 B1 * 3/2001 Chittipeddi et al. ......... 438/612
7,211,902 B2 * 5/2007 Yamaha ...................... 257/780
7,232,705 B2 * 6/2007 Righter ....................... 438/106

FOREIGN PATENT DOCUMENTS

| JP | 2002-222811 | 8/2002 |
| KR | 1020000009043 A | 2/2000 |
| KR | 100741910 B1 | 7/2007 |

* cited by examiner

*Primary Examiner*—Roy K Potter
(74) *Attorney, Agent, or Firm*—Volentine & Whitt, PLLC

(57) ABSTRACT

A bonding pad structure of a semiconductor device and a method of manufacturing the same reduce the likelihood of peel-off defects from occurring. The bonding pad structure includes a substrate, an interlayer insulation layer on the substrate, an upper wiring layer on the interlayer insulation layer, and a plurality of lower wiring layers disposed in the interlayer insulation layer between the upper wiring layer and the substrate and configured to prevent the interlayer insulation layer from cracking especially during a wire bonding process in which a wire is bonded to the upper wiring layer. For example, the respective areas occupied by the lower wiring layers sequentially increase in the interlayer insulation layer in a downward direction from the upper wiring layer towards the substrate. Also, each of the lower wiring layers may project further inwardly toward a central part of the bonding pad than the lower layer of wiring disposed above it in the interlayer insulation layer.

18 Claims, 11 Drawing Sheets

BONDING PAD STRUCTURE AND MANUFACTURING METHOD THEREOF

CROSS-REFERENCE TO RELATED APPLICATIONS

This application claims priority under 35 U.S.C. §119 from Korean Patent Application 10-2008-0129274, filed on Dec. 18, 2008.

BACKGROUND

The inventive concept relates to a bonding pad structure of a semiconductor device and to a method of manufacturing a bonding pad structure.

An integrated circuit of a semiconductor device is often electrically connected to an external device, circuitry, etc. by a wire. To this end, the wire is bonded to a bonding pad of the semiconductor device. The process of bonding the wire to the bonding pad mainly entails exerting a mechanical compressive force on the wire. This force is applied to the wire, and hence to the bonding pad, by a mechanical bonding apparatus. In general, the bonding pad includes a substrate, an upper wiring layer to which the wire is bonded, an interlayer insulation layer interposed between the upper wiring layer and the substrate, and at least one lower wiring layer embedded in the interlayer insulation layer.

The layout of the lower wiring layer(s) has been influenced by recent demands for smaller and smaller semiconductor devices. In particular, the interlayer insulation layer and the lower wiring layer(s) are becoming thinner as semiconductor devices are being scaled down. As a result, stress from the outside of the device has a relatively high chance of causing the bonding pad to crack. Specifically, the interlayer insulation layer tends to crack just below the upper wiring layer when the compressive force generated during a wire bonding process is applied to the bonding pad. This is especially prevalent in the case in which the interlay insulation layer is mainly formed of silicon oxide. Silicon oxide does not adhere well to metal and thus, the interlayer insulation layer of the bonding pad is likely to crack at its boundary with the upper wiring layer. In this case, the upper wiring layer can peel off of the interlayer insulation layer, i.e., a so-called peel-off defect occurs.

SUMMARY

According to an aspect of the inventive concept, there is provided a bonding pad of a semiconductor device including: a substrate, an interlayer insulation layer disposed on the substrate, an upper layer of wiring disposed on the interlayer insulation layer, and lower layers of wiring embedded in the interlayer insulation layer and configured to prevent the interlayer insulation layer from cracking. The lower layers of wiring are juxtaposed one above the other in the interlayer insulation layer between the upper layer of wiring and the substrate. Also, the lower layers of wiring are electrically conductively connected to the upper layer of wiring at a bottom surface of the upper layer of wiring that faces toward the substrate. The respective areas occupied by the lower layers of wiring sequentially increase in the interlayer insulation layer in a downward direction from the upper layer of wiring towards the substrate, and each of the lower layers of wiring projects further inwardly toward a central part of the bonding pad than the lower layer of wiring disposed above it in the interlayer insulation layer.

According to another aspect of the inventive concept, there is provided a bonding pad of a semiconductor device including: a substrate, interlayer insulation layers, an upper layer of wiring on the interlayer insulation layers, and lower wiring layers interposed between adjacent interlayer insulation layers and each having an opening therethrough, wherein the openings become wider towards the upper layer of wiring. The interlayer insulation layers and lower layers of wiring include a first interlayer insulation layer disposed on the substrate, a first lower layer of wiring having a first opening therethrough and disposed on the first interlayer insulation layer, a second interlayer insulation layer disposed on the first lower layer of wiring and buried in the first opening, a second lower layer of wiring having a second opening therethrough and disposed on the second interlayer insulation layer, and a third interlayer insulation layer disposed on the second lower layer of wiring and buried in the second opening. The second opening is thus wider than the first opening. The upper layer of wiring spans a region of the bonding pad over the second opening.

According to another aspect of the inventive concept, there is provided a method of manufacturing a bonding pad of a semiconductor device, the method comprising: forming a first interlayer insulation layer on a substrate, forming on the first interlayer insulation layer a first lower layer of wiring having a first opening therethrough, forming a second interlayer insulation layer on the first lower layer of wiring so as to be buried in the first opening, forming on the second interlayer insulation layer a second lower layer of wiring having therethrough a second opening wider than the first opening, forming a third interlayer insulation layer on the second lower layer of wiring so as to be buried in the second opening, and forming an upper wiring layer on the third interlayer insulation layer as spanning a region of the bonding pad over the second opening.

BRIEF DESCRIPTION OF THE DRAWINGS

The inventive concept will become more fully understood from the detailed description that follows with reference to the accompanying drawings, wherein.

DETAILED DESCRIPTION OF THE EMBODIMENTS

The inventive concept now will be described more fully hereinafter with reference to the accompanying drawings.

Figure 1:
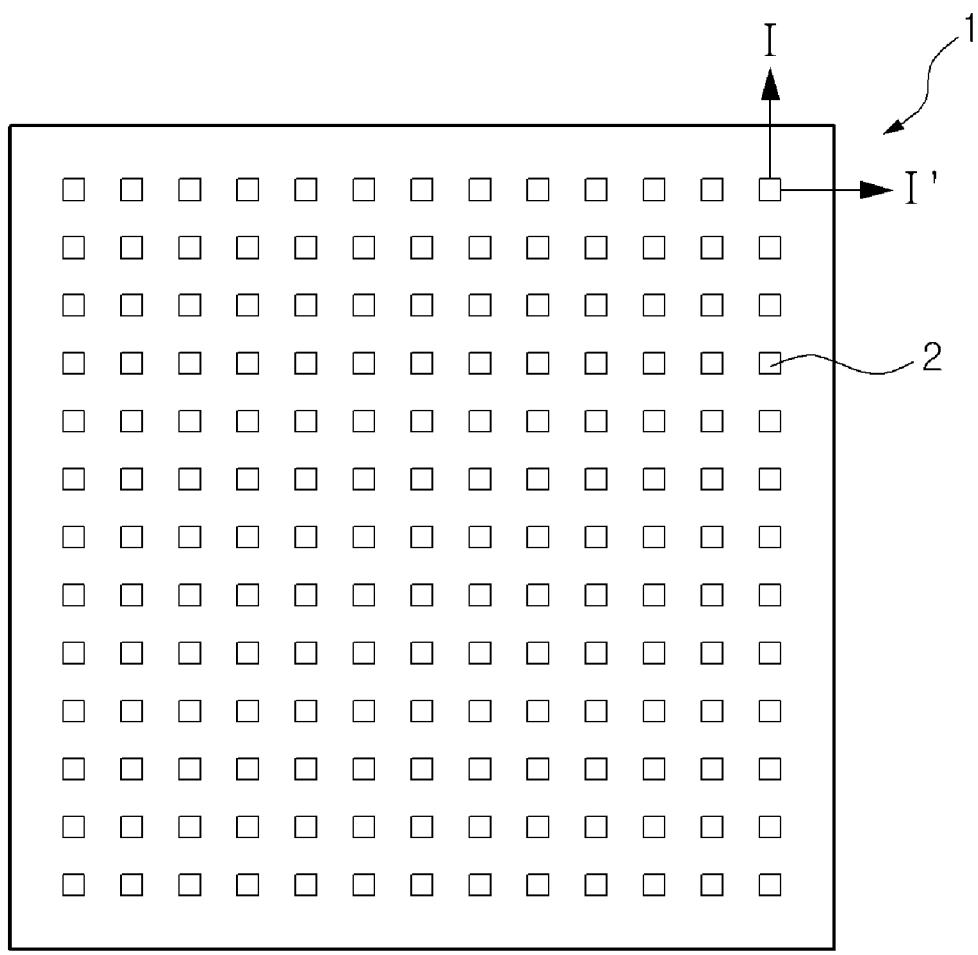
FIG. 1 is a plan view of a die having bonding pads according to the inventive concept.

FIG. 1 shows a die 1 including an array of bonding pads 2 of a semiconductor device according to the inventive concept.

Figure 2:
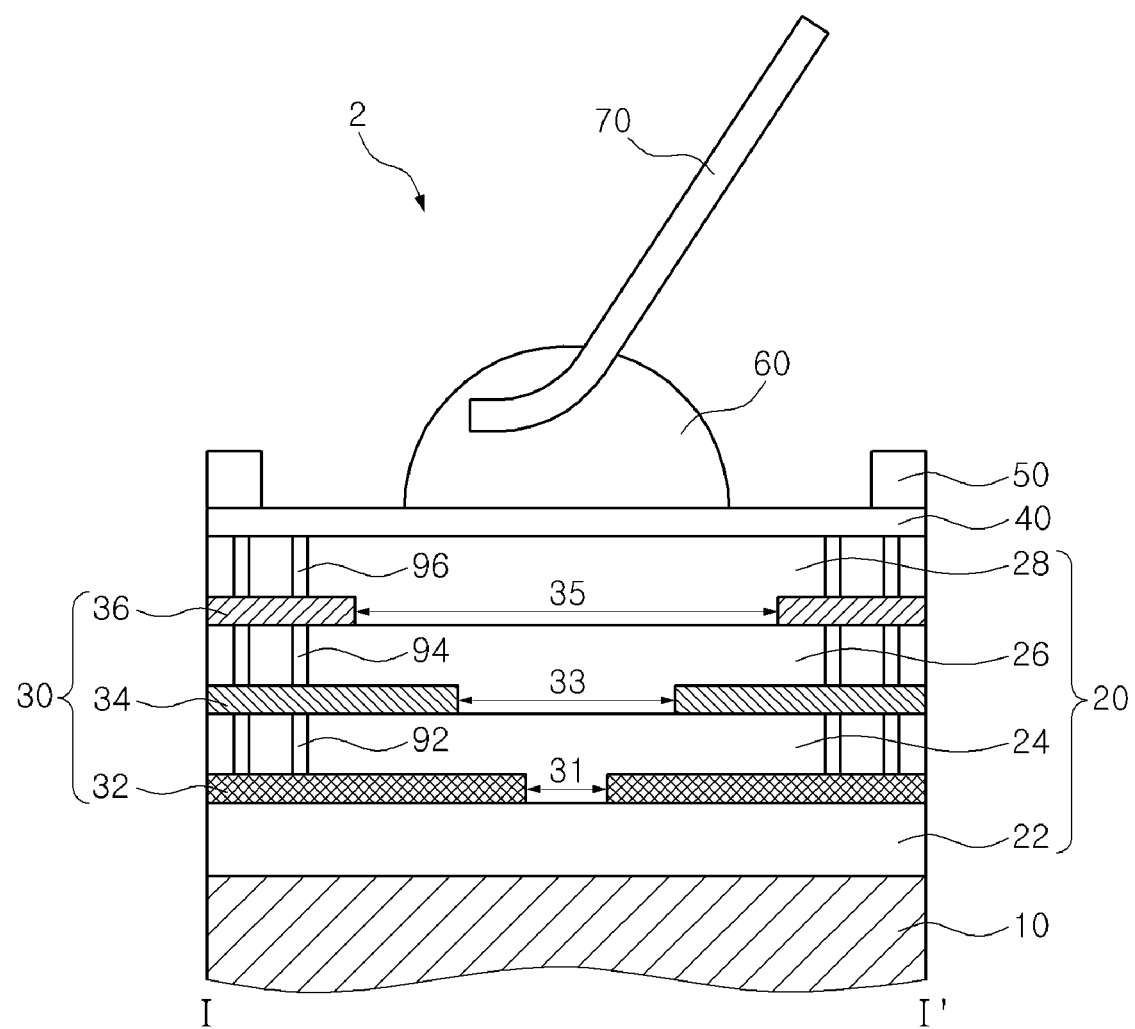
FIG. 2 is a cross-sectional view of a bonding pad structure of a semiconductor device according to the inventive concept, as would be seen in the direction of line I-I' of FIG. 1.

As shown in FIG. 2, an embodiment of the bonding pad 2 includes a substrate 10, an interlayer insulation layer 20 disposed on the substrate, a plurality of lower wiring layers 30 vertically spaced from one another (juxtaposed) throughout the interlayer insulation layer 20, and an upper wiring layer 40 disposed on the interlayer insulation layer 20. The lower wiring layers 30 collectively have a stepped configuration characterized in that the respective areas thereof increase in the vertically downward direction (from the upper wiring layer 40 to the substrate 10), and each lower wiring layer 30 projects further inwardly (toward the center of the bonding pad 2) than the lower wiring layer above it.

The bonding pad 2 also has a passivation layer 50. The upper wiring layer 40, which is the last metal layer on the surface of the die 1, is selectively exposed by the passivation layer 50. More specifically, the passivation layer 50 has openings therethrough which expose the upper wiring layer 40 of each of the bonding pads 2 of the die 1, respectively. In an example of this embodiment, each opening is square. Furthermore, in this example, a respective rounded conductor in the form of a ball 60 is situated on the upper wiring layer 40 at the center of each opening in the passivation layer 50. The wire 70 is bonded to the bonding pad 2 via the ball 60.

The interlayer insulation layer 20 is mainly formed of silicon oxide. The interlayer insulation layer 20 electrically isolates wiring (not shown) on the substrate 10, and is planarized so as to rid the upper surface of the layer 20 of steps that would otherwise be present as a result of the forming of layer 20 over such wiring. Also, and although not shown in the drawing, the interlayer insulation layer 20 has contact holes extending vertically therethrough, and contact plugs occupying the contacts holes are electrically conductively connected to the wiring.

The lower wiring layers 30 are interlayer metal layers, and may each have the form of a ring or loop. In the example of the inventive concept shown in FIG. 2, the wiring layers 30 include a first lower wiring layer 32 having a first opening 31, a second lower wiring layer 34 having a second opening 33 larger than the first opening 31, and a third lower wiring layer 36 having a third opening 35 larger than the second opening 33. However, the inventive concept is not so limited. For example, a fourth lower wiring layer having a fourth opening larger than the third opening part 35 may be provided in the interlayer insulation layer 20 above the third lower wiring layer 36. In any case, the openings in the wiring layers 30 become sequentially smaller in a direction from the upper wiring layer 40 towards the substrate 10.

Accordingly, in the bonding pad 2 of a semiconductor device according to an embodiment of the inventive concept, that portion of the interlayer insulation layer 20 located beneath the exposed part of the upper wiring layer 40 is generally wedge-shaped and more specifically, has the form of an inverted square pyramid or at least a section (frustum) of such a pyramid. As is clear from the drawings, this portion of the interlayer insulation layer 20 is delimited by planes each extending between the upper wiring layer 40 and the substrate 10 and each connecting a respective set of edges of the wiring layers 32, 34 and 36 on the same side of the openings 31, 33 and 35.

A first contact plug 92 extends through the second interlayer insulation layer 24 between the first lower wiring layer 32 and the second lower wiring layer 34 so as to electrically conductively connect the wiring layers 32 and 34. A second contact plug 94 extends through the third interlayer insulation layer 26 between the second and third lower wiring layers 34 and 36 so as to electrically conductively connect the wiring layers 34 and 36. A third contact plug 96 extends through the interlayer insulation layer 20 between the upper wiring layer 40 and the third lower wiring layer 36 so as to electrically conductively connect the third wiring layer 36 and the upper wiring layer 40. In the embodiment of the bonding pad 2 of a semiconductor device according to the inventive concept, the first to third contact plugs 92 to 96 all extend through the lower interlayer insulation layer 20 beneath an outer peripheral portion of the upper wiring layer 40 and more specifically, beneath the outer periphery of that part of the upper wiring layer exposed by the passivation layer 50 and outwardly of the ball 60 by which the wire 70 is bonded to the upper wiring layer 40.

The upper wiring layer 40 is generally formed of aluminum or an aluminum alloy. The wire 70 is generally formed of gold or a gold alloy. The ball 60 coupling the upper wiring layer 40 and the wire 70 is formed of copper, silver, gold or an alloy of copper, silver or gold. Hence, the wire 70 is electrically conductively connected to the upper wiring layer 40. Although not shown in the drawing, a bonding apparatus presses the wire 70 and the ball 60 together and thereby exerts a mechanical compressive force at the center of the upper wiring layer 40 to bond the wire 70 to the ball 60 and hence, to the bonding pad 2.

Figure 3:
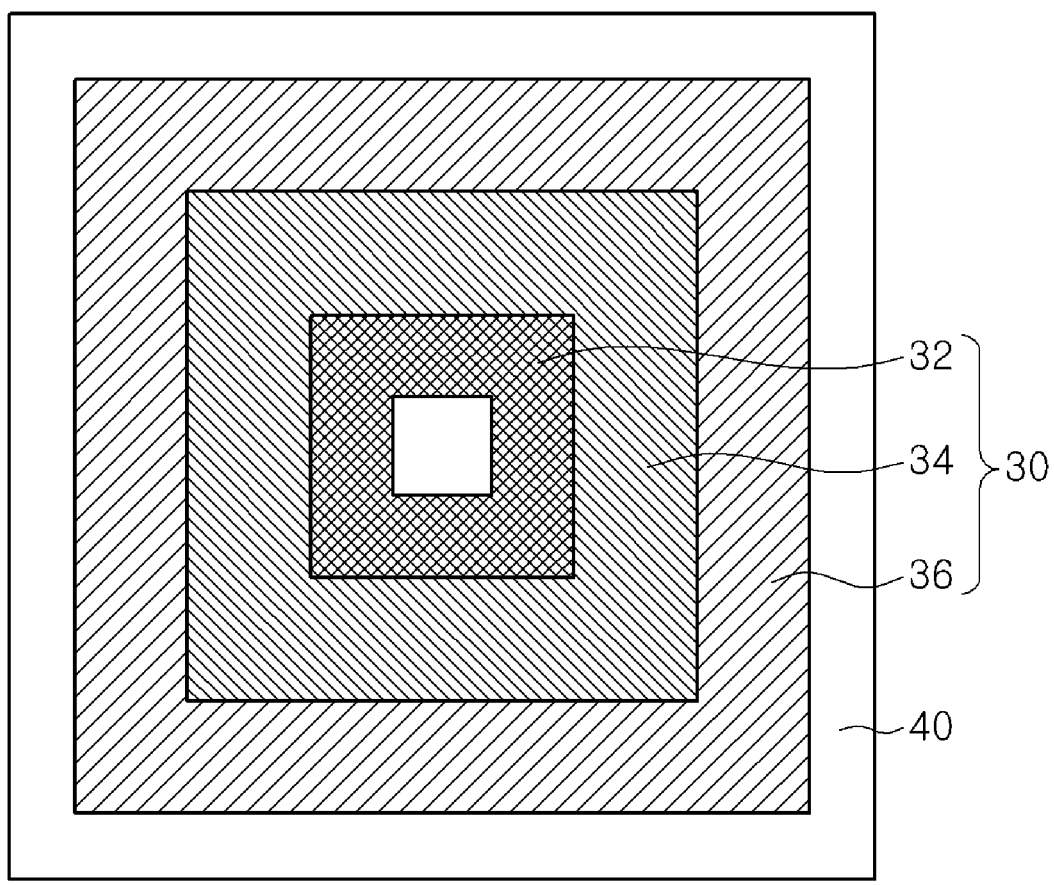
FIG. 3 is an enlarged plan view of a bonding pad of the die shown in FIG. 1.

Also according to the inventive concept as best shown in FIG. 3, the outer edges of the ring or loop-shaped lower wiring layers are vertically aligned with those of the upper wiring layer 40, and the surface areas of the lower wiring layers 30 gradually increase in the depth-wise direction of the interlayer insulation layer 20. Thus, the opening in the lower wiring layer 36 closest to the upper wiring layer 40 is relatively large, and a relatively large area of surface contact exists between the interlayer insulation layer 20 and the lower wiring layers 30.

Figure 4A:
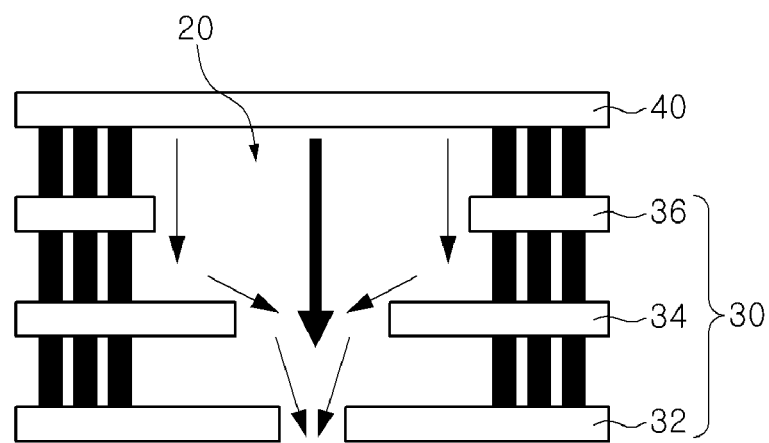
FIGS. 4A and 4B are schematic diagrams of bonding pads according to the inventive concept and the related art, respectively.
Figure 4B:
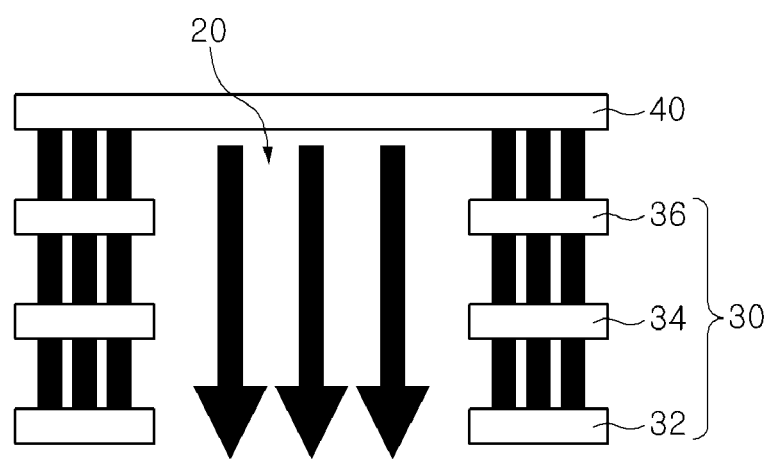

The significance and advantages of such features of a bonding pad according to the inventive concept will become even clearer from FIGS. 4A and 4B.

FIG. 4A schematically shows an embodiment of a bonding pad 2 according to the inventive concept, the compressive force of the wire bonding process being represented by the arrows in the figure. The compressive force is reduced by the lower wiring layers 30 in the interlayer insulation layer 20.

In particular, the lower wiring layers 30 reinforce the interlayer insulation layer 20 beneath the exposed part of the upper wiring layer 40, i.e., the lower wiring layer 30 present a large amount of surface area to the interlayer insulation layer 20 beneath the exposed part of the upper wiring layer. Also, the third lower wiring layer 36 adjacent to the upper wiring layer 40 provides a relatively large opening 35 so that there is no thin section of the interlayer insulation layer 20 which receives the compressive force. The likelihood of the interlayer insulation layer 20 cracking due to the compressive force created by the wire bonding process is thus substantially reduced by virtue of the configuration of the lower wiring layers 30. Furthermore, the first lower wiring layer 32 has a relatively large surface area, extending even into the region beneath that over which the compressive force is applied. Therefore, the conductive path through the bonding pad 2 is highly reliable.

On the other hand, as shown in FIG. 4B, in a bonding pad according to the related art, the lower wiring layers 30 all extend only beneath the outer peripheral portion of the upper wiring layer 40. A contact area of the lower wiring layer 30 and the interlayer insulation layer 20 is relatively small, thus easily causing crack. Thus, the compressive force applied to the upper wiring layer 40 during the wire bonding process is transferred intact from an upper part of the interlayer insulation layer 20 to a lower part thereof. As a result, the lower wiring layer 30 and the interlayer insulation layer 20 are prone to cracking.

Figure 5:
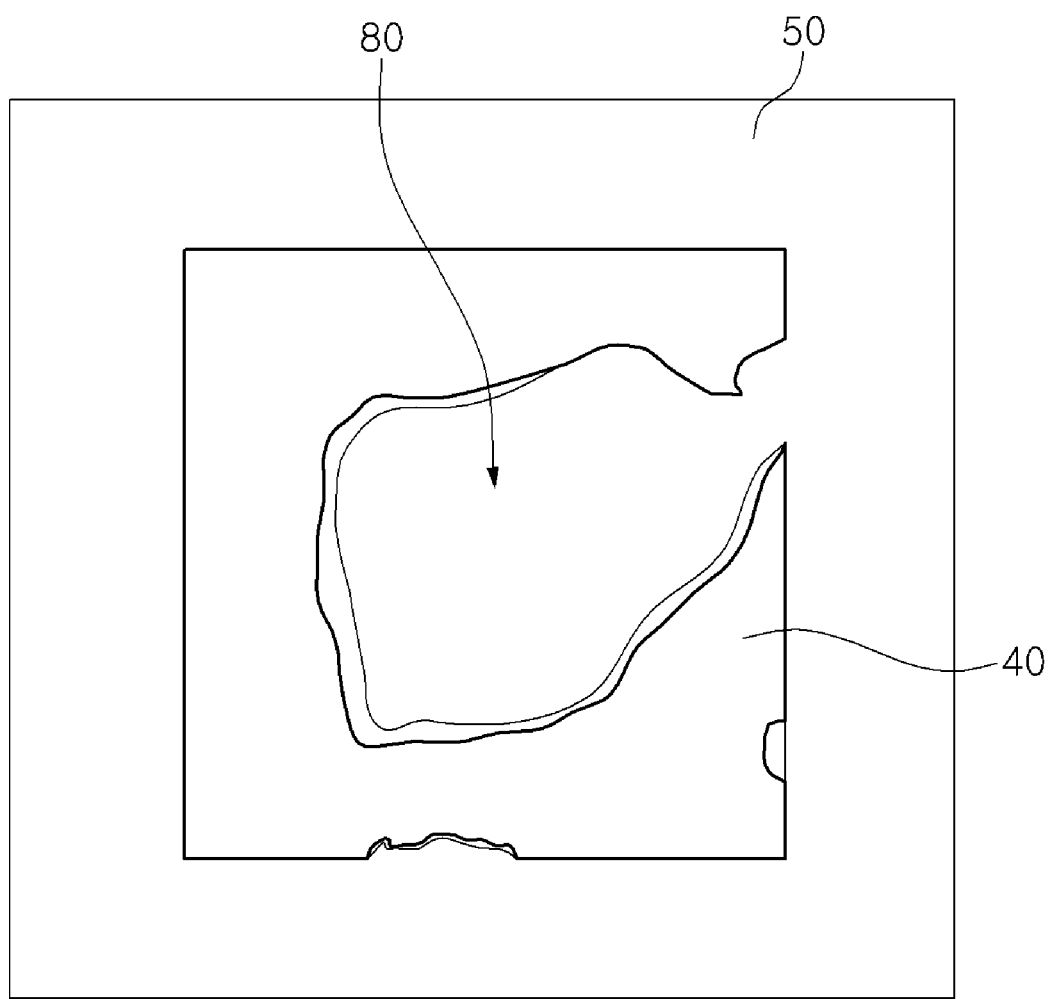
FIG. 5 is a plan view of a bonding pad according to the related art, showing a peel-off defect.
Figure 6:
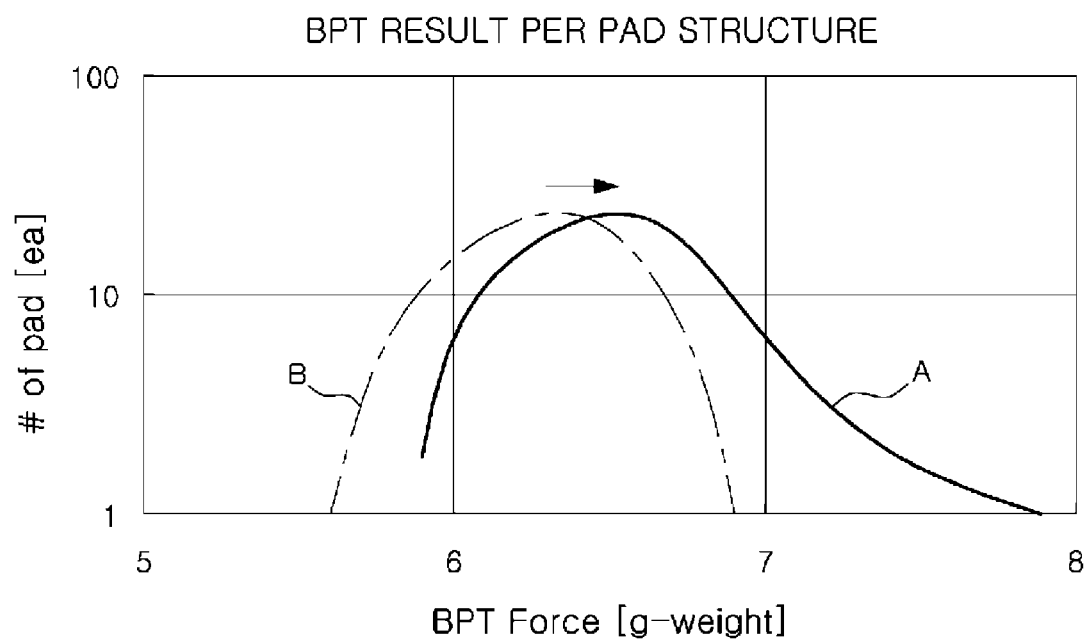
FIG. 6 is a graph of BPT results for bonding pads according to the inventive concept and the related art.

The cracking may produce a peel-off defect 80 at a central portion of the upper wiring layer 40 as shown in FIG. 5. Referring to FIG. 5, when wire 70 electrically coupled to the upper wiring layer 40 is pulled by a given force, the cracking allows the central portion of the upper wiring layer 40 to peel off the interlay insulation layer 20 whereas the peripheral part of the wiring layer 40 remains intact due to the coupling of the peripheral part of the wiring layer 40 to the lower wiring layers 30 by the contact plugs (represented by the thick dark lines in FIG. 4B). The pull on the wire 70 may occur when the structure is subjected to a post-manufacture package or ball pulling test (hereinafter, referred to as 'BPT'), FIG. 6 is a graph of BPT results of bonding pads according to an embodiment of the inventive concept and the related art. The pulling force in g-weight or $g \cdot cm/s^2$ is plotted along the transverse axis of the graph, and a common logarithm value for the number of bonding pads 2 is plotted along the vertical axis. Also, line A represents test results of bonding pads embodied according to the inventive concept (i.e., according to the configuration represented in FIG. 4A) and line B represents test results of bonding pads embodied according to the related art (i.e., according to the configuration represented in FIG. 4B).

In FIG. 6, as can be seen from test results A, the peel-off defect 80 is produced in a bonding pad embodied according to the inventive concept mostly when a pulling force of approximately 6.6 g-weight ($g \cdot cm/s^2$) is applied thereto. On the other hand, test results B show that the peel-off defect 80 is produced in a bonding pad according to the related art mostly when a pulling force of approximately 6.4 g-weight ($g \cdot cm/s^2$) is applied thereto. That is, a bonding pad according to the inventive concept is more resistant to peel-off defects, by an average of approximately 0.2 g-weight ($g \cdot cm/s^2$), than a corresponding bonding pad according to the related art.

As described above, in a bonding pad 2 of a semiconductor device according to the inventive concept, the propensity of the interlayer insulation layer 20 to crack is allayed by the lower wiring layers 30 which each extend from an edge of the bonding pad towards the center thereof and whose areas sequentially increase in the depth-wise direction of the interlayer insulation layer 20. Thus, peel-off defect of the upper wiring layer 40 are prevented from occurring.

An embodiment of a method of manufacturing a bonding pad 2 of a semiconductor device according to the inventive concept will now be described with reference to FIGS. 7A to 7J.

Figure 7A:
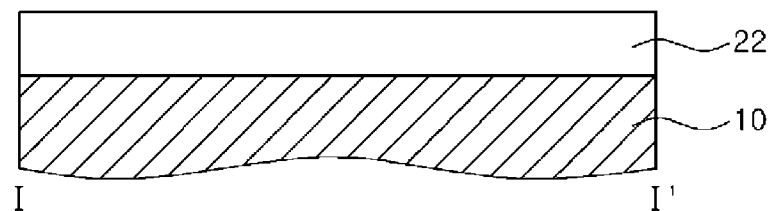
FIGS. 7A to 7J are each a cross-sectional view of a substrate and together illustrate an embodiment of a method of manufacturing a bonding pad of a semiconductor device according to the inventive concept.

As illustrated in FIG. 7A, as a backend process, a first interlayer insulation layer 22 is formed on substrate 10 on which a device, e.g., an electronic memory, is provided. The first interlayer insulation layer 22 is a dielectric layer such as a silicon oxide layer that will electrically isolate the substrate 10 from wiring lines. The first interlayer insulation layer 22 may be formed by a rapid thermal process or by chemical vapor deposition. Furthermore, and although not shown in the drawing, a sub contact plug may be produced by removing a portion of the first interlayer insulation layer 22 to form a sub contact hole, forming a layer of metal such as tungsten on the first interlayer insulation layer 22 to such a thickness as to fill the sub contact hole, and then planarizing the resultant structure to expose the first interlayer insulation layer 22 and leave a plug of the metal in the sub contact hole. Note, the first interlayer insulation layer 22 is planarized to rid the layer of steps which might otherwise exist at the upper surface thereof due to elements on the substrate over which the layer 22 is formed, so that subsequent layers may be readily formed on the first interlayer insulation layer 22.

Figure 7B:
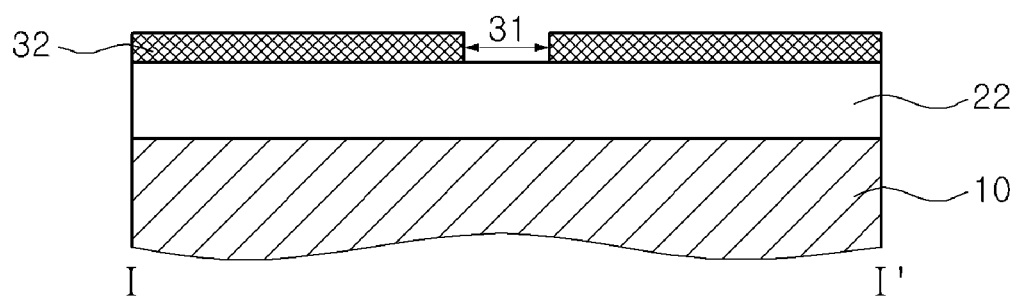

As shown in FIG. 7B, a first lower wiring layer 32 having a first opening 31 is formed on the first interlayer insulation layer 22. The first lower wiring layer 32 comprises aluminum and is formed through a physical vapor deposition or chemical vapor deposition process such as a sputtering. Accordingly, the first lower wiring layer 32 may be electrically connected to the substrate 10 through the sub contact plug. The first opening 31 is formed in the layer 22 by conventional means known per se in the art.

The first lower wiring layer 32 may further comprise titanium or titanium nitride as a barrier metal layer to prevent oxidation at the boundary between the first interlayer insulation layer 22 and the lower wiring layer 32, and at the boundary between the first lower wiring layer 32 and the next layer formed thereon.

Figure 7C:
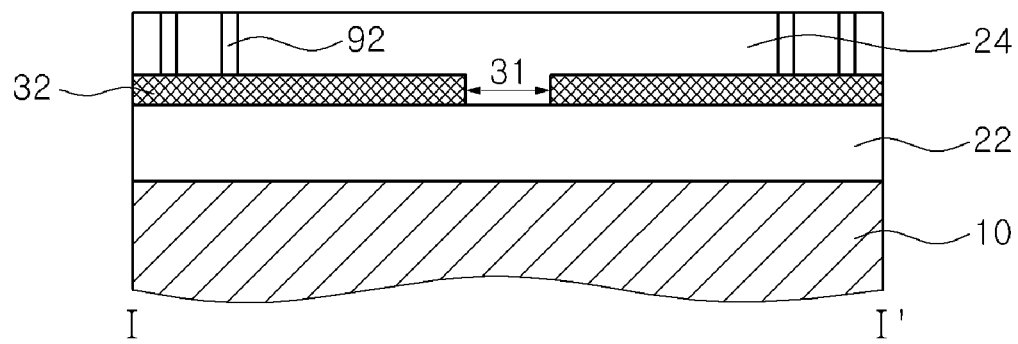

As illustrated in FIG. 7C, that next layer is second interlayer insulation layer 24. The second interlayer insulation layer 24 is formed on, i.e., is stacked on, the first lower wiring layer 32 and thereby buries the first opening 31. The second interlayer insulation layer 24 comprises silicon oxide similarly to the first interlayer insulation layer 22. In addition, a contact hole is formed in the second interlayer insulation layer 24 so as to expose the first lower wiring layer 32, a layer of conductive material is then formed on the second interlayer insulation layer 24 to such a thickness as to fill the contact hole, and the resultant structure is planarized to form first contact plug 92 in the contact hole. Accordingly, the first contact plug 92 is (electrically conductively) connected to the first lower wiring layer 32.

Figure 7D:
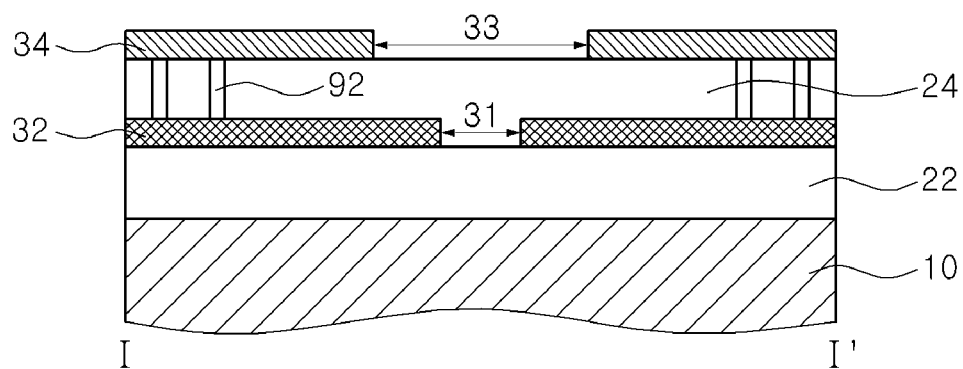

As illustrated in FIG. 7D, a second lower wiring layer 34 having a second opening 33 larger than the first opening 31 is formed on the second interlayer insulation layer 24. Thus, the area of the second interlayer insulation layer 24 exposed by the second opening 33 is larger than the area of the first interlayer insulation layer 22 exposed by the opening 31 of the first lower wiring layer 32. The second lower wiring layer 34 comprises aluminum, and titanium or titanium nitride at its boundary with the second interlayer insulation layer 24.

Figure 7E:
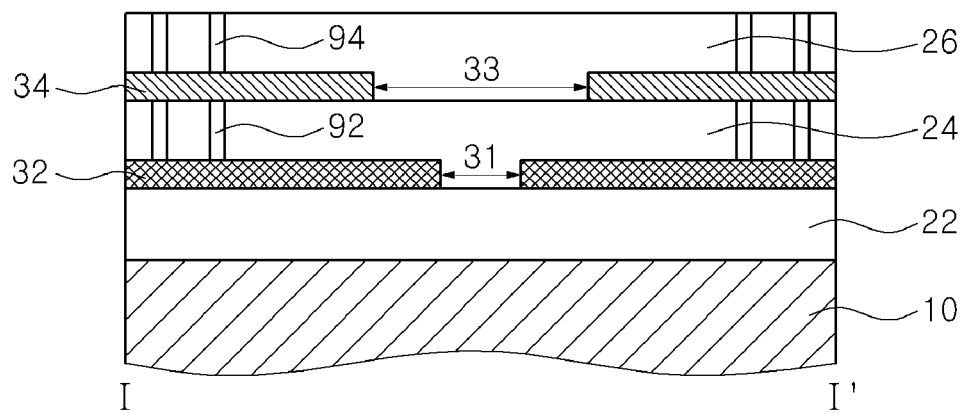

As shown in FIG. 7E, a third interlayer insulation layer 26 is formed on over the entire surface of the substrate 10 on the second lower wiring layer 34 so as to bury the second opening 33. The third interlayer insulation layer 26 comprises silicon oxide and has a contact plug 94 extending therethrough into contact with the second wiring layer 34. More specifically, an insulation layer of a given thickness is formed on the second lower wiring layer 34, a portion of the insulation layer is removed to form a contact hole that exposes the second lower wiring layer 34, and a conductive (metal) layer is formed on the insulation layer so as to fill the contact hole. Then, the resultant structure is planarized.

Figure 7F:
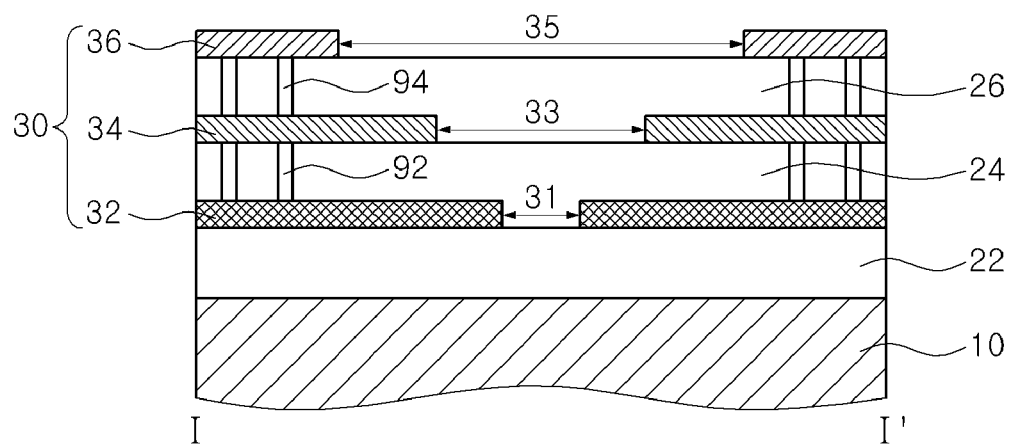

As illustrated in FIG. 7F, a third lower wiring layer 36 having a third opening 35 larger than the second opening part 33 is formed on the third interlayer insulation layer 26. The area of the second interlayer insulation layer 26 exposed by the third opening 35 is larger than the area of the second interlayer insulation layer 24 exposed by the second opening 33.

Figure 7G:
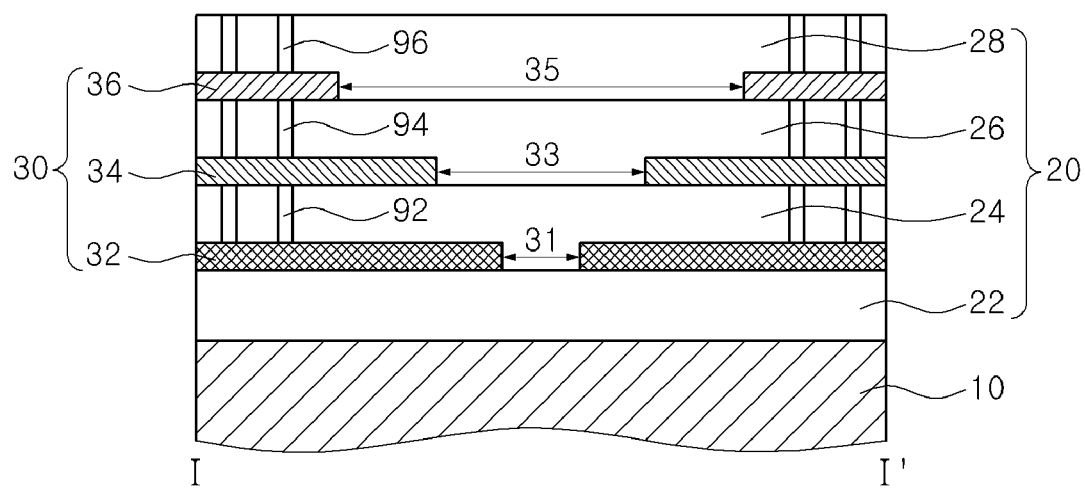

As illustrated in FIG. 7G, fourth interlayer insulation layer 28 is formed on the third lower wiring layer 36 so as to bury the third opening 35. Similarly to the first to third interlayer insulation layers 22 to 26, the fourth interlayer insulation layer 28 comprises silicon oxide. The fourth interlayer insulation layer 28 may also be formed in a manner similar to the first to third interlayer insulation layers 22 to 26. That is, insulating material is deposited on the third lower wiring layer 36, a contact hole exposing the third lower wiring layer 36 is formed, a layer of conductive material is formed on the insulating material to fill the contact hole, and the resultant structure is planarized to form the third contact plug 96 in the contact hole. The third contact plug 96 is thus electrically conductively connected to the third lower wiring layer 36.

Furthermore, the first, second and third openings 31, 33 and 35 are formed so as to be disposed vertically one above the other, with the second opening spanning the entire region over which the first opening 3 extends and the third opening 35 spanning the entire region over which the second opening 33 extends. In this embodiment, the openings 31, 33 and 35 are formed with their geometrical centers aligned along the same vertical axis. Thus, a stabilized wedge-shaped portion of the second, third and fourth interlayer insulation layers 24, 26 and 28 is formed within the openings 31, 33 and 35. Specifically, the wedge-shaped portion is delimited by planes that respectively connect adjacent edges of the wiring layers 32, 34 and 36 which delimit the openings 31, 33 and 35. Accordingly, the wedge-shaped portion is a frustum of an inverted regular pyramid.

Figure 7H:
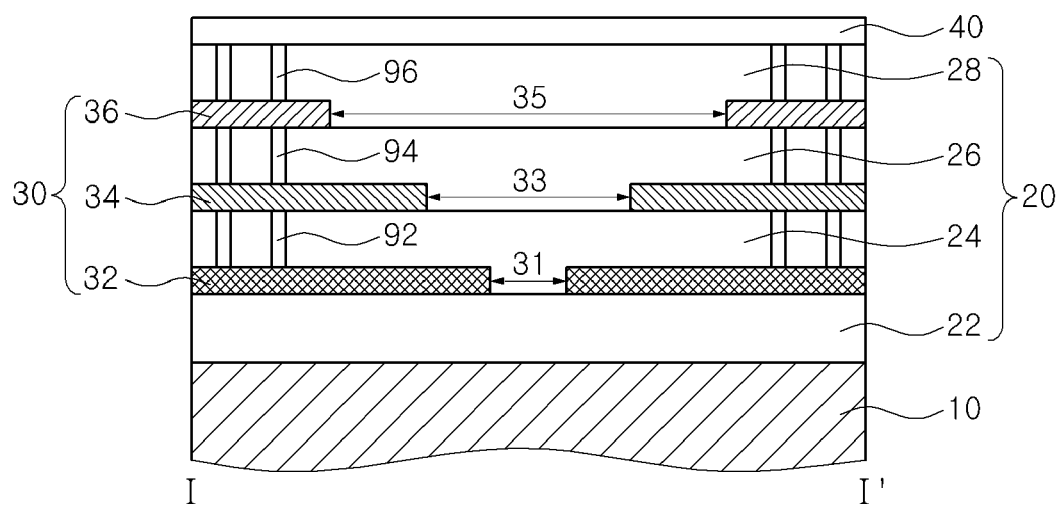

As shown in FIG. 7H, upper wiring layer 40 is formed on the fourth interlayer insulation layer 28 and spans the region over which the third opening 35 extends. The upper wiring layer 40 is a square layer whose outer periphery is aligned with that of the third lower wiring layer 36 (and in general, with that of the lower wiring layers 30). Also, the upper wiring layer 40 is electrically conductively connected to the contact plug 96 at an outer peripheral portion of the layer 40.

Figure 7I:
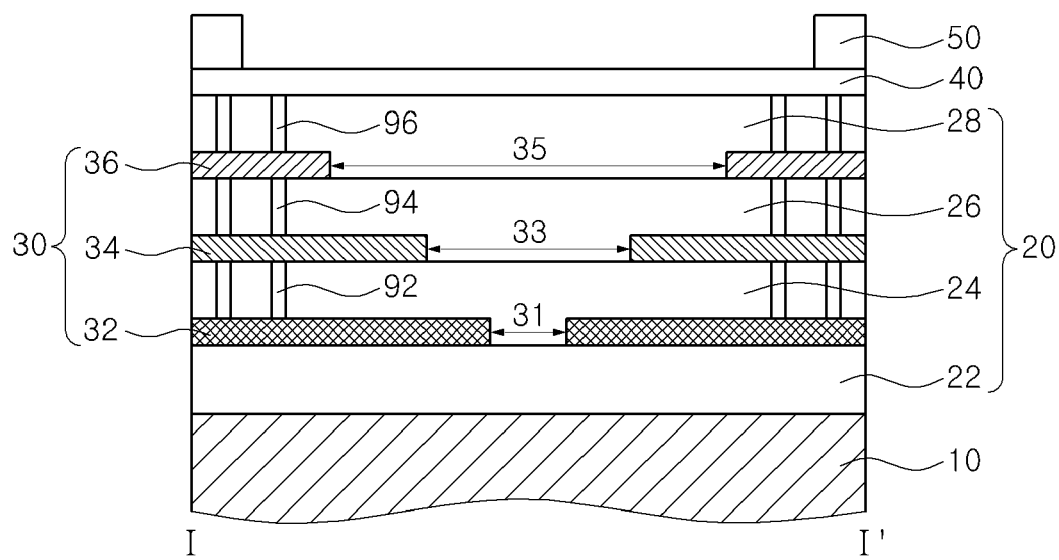

As illustrated in FIG. 7I, a passivation layer 50 is formed on the upper wiring layer 40. The passivation layer 50 selectively exposes the upper wiring layer 40, e.g., exposes a central part of the upper wiring layer 40 while covering an outer peripheral portion of the upper wiring layer 40.

Figure 7J:
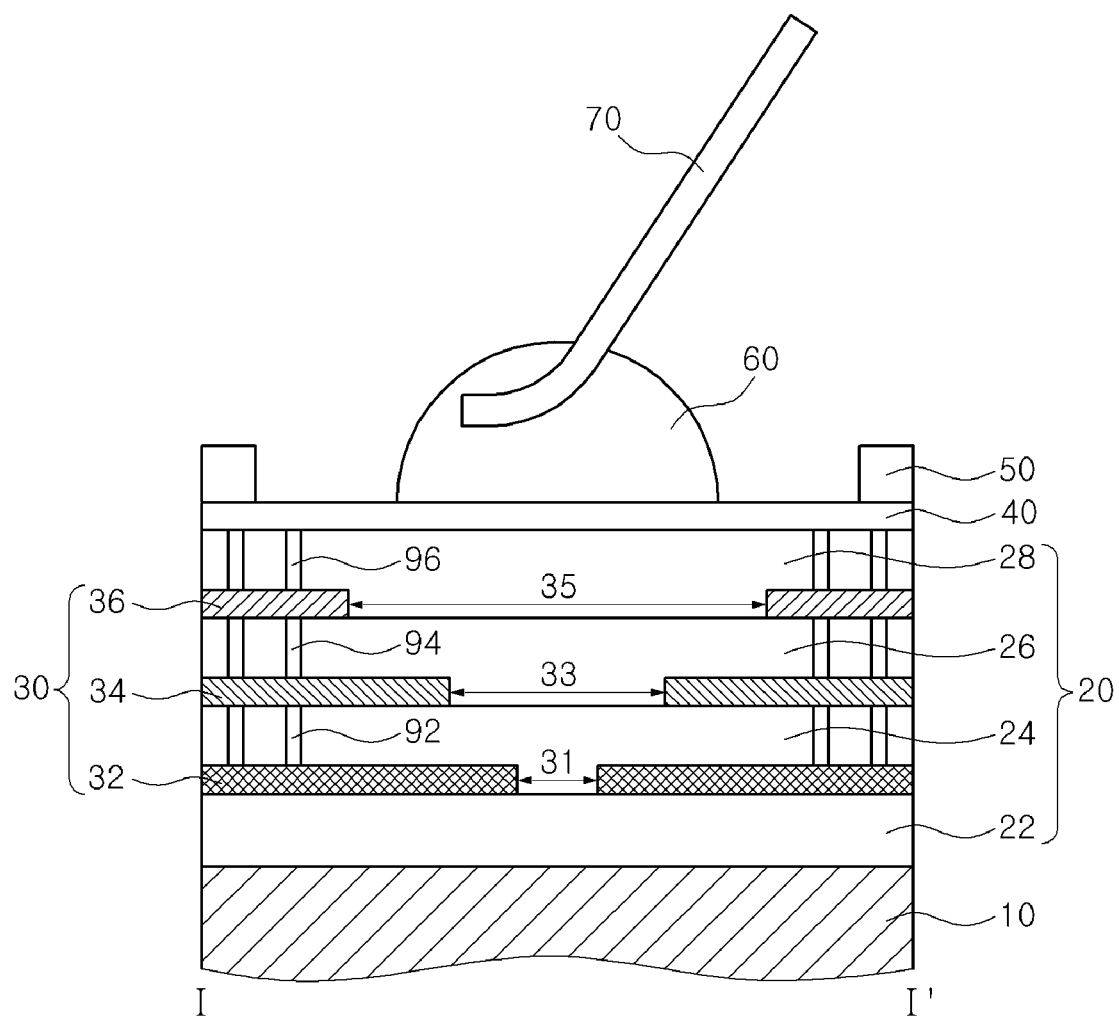

As shown in FIG. 7J, a wire 70 is bonded to the upper wiring layer 40. More specifically, the wire 70 is pressed together with a ball 60 against that part of the upper wiring layer 40 exposed by the passivation layer 50. As a result of this compressive force, the wire 70 is joined to the upper wiring layer 40 through the intermediary of the ball 60. At this time, the interlayer insulation layer 20 serves as a support layer which receives the downward compressive force applied to the upper wiring layer 40 during the bonding of the wire 70 to the pad 2.

According to the inventive concept as described above, the interlayer insulation layer 20 is fabricated so as to have a wedge-shaped or tapered portion in the form of at least a frustum of an inverted pyramid. The stepped configuration of the lower wiring layers 32, 34 and 36 provides the taper or wedge shape and in effect, reinforce the interlayer insulation layer beneath the exposed portion of the upper wiring layer 40. This prevents the compressive force exerted on the bonding pad during the bonding of a wire to the upper wiring layer 40 from propagating straight through the interlayer insulation layer 20. Therefore, the interlayer insulation layer 20 is not likely to crack when the compressive force is exerted on the bonding pad during the wire bonding process. Accordingly, a bonding pad according to the inventive concept is highly durable and reliable and a method of manufacture according to the inventive concept can result in a high yield of bonding pads.

Finally, embodiments of the inventive concept have been described hereinabove in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the description of the embodiments above but by the following claims.

What is claimed is:

1. A bonding pad of a semiconductor device, comprising:
a substrate;
an interlayer insulation layer disposed on the substrate;
an upper layer of wiring disposed on the interlayer insulation layer; and
a plurality of lower layers of wiring juxtaposed one above the other in the interlayer insulation layer between the upper layer of wiring and the substrate, the lower layers of wiring being electrically conductively connected to the upper layer of wiring at a bottom surface of the upper layer of wiring that faces toward the substrate, and
wherein the respective areas occupied by the lower layers of wiring sequentially increase in the interlayer insulation layer in a downward direction from the upper layer of wiring towards the substrate, and each of the lower layers of wiring projects further inwardly toward a central part of the bonding pad than the lower layer of wiring disposed above it in the interlayer insulation layer.

2. The bonding pad of claim 1, wherein each of the lower layers of wiring has an opening therethrough, whereby each of the lower layers of wiring has edges that define the opening, and the openings in the lower layers of wiring each span the central part of the bonding pad.

3. The bonding pad of claim 2, wherein the respective widths of the openings in the lower layers of wiring decrease in the downward direction.

4. The bonding pad of claim 3, wherein the interlayer insulation layer has a wedge-shaped portion located between the upper layer of wiring and the substrate, the wedge-shaped portion being delimited by planes each connecting the edges of the lower layers of wiring at a respective side of the openings.

5. The bonding pad of claim 4, wherein the lower layers of wiring are each in the form of a loop, and the centers of the openings are aligned in the downward direction such that the wedge-shaped portion of the interlayer insulation layer has the form of a frustum of an inverted pyramid.

6. The bonding pad of claim 2, further comprising a passivation layer disposed on the upper layer of wiring and exposing the upper layer of wiring at the central part of the bonding pad.

7. The bonding pad of claim 2, in combination with a rounded body of electrically conductive material disposed on the upper wiring layer at the central part of the bonding pad.

8. The bonding pad of claim 6, in combination with a rounded body of electrically conductive material disposed at the central part of the bonding pad on the part of the upper wiring layer exposed by the passivation layer.

9. A bonding pad of a semiconductor device, comprising:
a substrate;
a first interlayer insulation layer disposed on the substrate;
a first lower layer of wiring having a first opening therethrough and disposed on the first interlayer insulation layer;
a second interlayer insulation layer disposed on the first lower layer of wiring and buried in the first opening;
a second lower layer of wiring having a second opening therethrough and disposed on the second interlayer insulation layer, the second opening being wider than the first opening;

a third interlayer insulation layer disposed on the second lower layer of wiring and buried in the second opening; and an upper layer of wiring disposed on the third interlayer insulation layer and spanning a region of the bonding pad over the second opening.

10. The structure of claim 9, further comprising at least one additional lower layer of wiring and at least one additional interlayer insulation layer interposed between the third interlayer insulation layer and the upper layer of wiring, each said additional lower layer of wiring having a respective opening therethrough wider than the opening in each of the lower layers of wiring beneath it, and each said interlayer insulation layer disposed on a said additional lower layer of wiring and buried in its opening.

11. The structure of claim 9, wherein the second interlayer insulation layer has a first contact hole therethrough, the third interlayer insulation layer has a second contact hole therethrough, and further comprising a first contact plug extending in the first contact hole and electrically conductively connecting the first lower layer of wiring and the second lower layer of wiring, and a second contact plug extending in the second contact hole and electrically conductively connected to the second lower layer of wiring.

12. The bonding pad of claim 9, wherein the lower layers of wiring are each in the form of a loop, and the centers of the openings are aligned in the downward direction.

13. The bonding pad of claim 9, further comprising a passivation layer disposed on the upper layer of wiring and exposing the upper layer of wiring at the central part of the bonding pad.

14. The bonding pad of claim 9, in combination with a rounded body of electrically conductive material disposed on the upper wiring layer at the central part of the bonding pad.

15. The bonding pad of claim 13, in combination with a rounded body of electrically conductive material disposed at the central part of the bonding pad on the part of the upper wiring layer exposed by the passivation layer.

16. A method of manufacturing a bonding pad of a semiconductor device, the method comprising:

forming a first interlayer insulation layer on a substrate;

forming a first lower layer of wiring, having therethrough a first opening, on the first interlayer insulation layer;

forming a second interlayer insulation layer on the first lower layer of wiring so as to be buried in the first opening;

forming a second lower layer of wiring, having therethrough a second opening wider than the first opening, on the second interlayer insulation layer;

forming a third interlayer insulation layer on the second lower layer of wiring so as to be buried in the second opening; and forming an upper wiring layer on the third interlayer insulation layer as spanning a region of the bonding pad over the second opening.

17. The method of claim 16, further comprising forming on the third interlayer insulation layer at least one an additional lower layer of wiring having an opening therethrough wider than the openings in the lower layers of wiring beneath it, and forming a respective interlayer insulation layer on each said additional lower layer of wiring as buried in the opening in the additional lower layer of wiring.

18. The method of claim 16, further comprising, forming a first contact hole extending through the second interlayer insulation layer to the first lower wiring layer, and then forming a first contact plug within the first contact hole; and forming a second contact hole extending through the third interlayer insulation layer to the second lower wiring layer, and then forming a second contact plug within the second contact hole.

* * * * *